(12) United States Patent
Patra (10) Patent No.: US 9,280,061 B2
(45) Date of Patent: Mar. 8, 2016

(54) ILLUMINATION OPTICAL UNIT FOR EUV PROJECTION LITHOGRAPHY

(71) Applicant: Carl Zeiss SMT GmbH, Oberkochen (DE)

(72) Inventor: Michael Patra, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 14/465,135

(22) Filed: Aug. 21, 2014

(65) Prior Publication Data

US 2014/0362361 A1   Dec. 11, 2014

Related U.S. Application Data

(63) Continuation of application No. PCT/EP2013/054856, filed on Mar. 11, 2013.

(60) Provisional application No. 61/612,450, filed on Mar. 19, 2012.

(30) Foreign Application Priority Data

Mar. 19, 2012   (DE) .................. 10 2012 204 273

(51) Int. Cl.
*G03B 27/54* (2006.01)
*G03B 27/42* (2006.01)
(Continued)

(52) U.S. Cl.
CPC ............ *G03F 7/702* (2013.01); *G02B 26/0833* (2013.01); *G03F 7/70075* (2013.01); *G03F 7/70083* (2013.01); *G02B 26/0825* (2013.01)

(58) Field of Classification Search
CPC .. G03F 7/702; G03F 7/70075; G03F 7/70083

USPC .................... 355/52, 53, 55, 67, 71
See application file for complete search history.

(56) References Cited

U.S. PATENT DOCUMENTS 6,438,199 B1   8/2002   Schultz et al.
6,658,084 B2   12/2003   Singer
(Continued)

FOREIGN PATENT DOCUMENTS

DE   2008 009 600 A1   8/2009
EP      1 225 481 A    7/2002
(Continued)

OTHER PUBLICATIONS

The International Search Report for corresponding PCT Appl No. PCT/EP2013/054856, dated Jul. 16, 2013.
(Continued)

*Primary Examiner* — Hung Henry Nguyen
(74) *Attorney, Agent, or Firm* — Fish & Richardson P.C.

(57) ABSTRACT

An illumination optical unit for EUV projection lithography serves for guiding illumination light towards an illumination field, in which a lithography mask can be arranged. The illumination optical unit has a first facet mirror having a plurality of individual mirrors. The latter predefine illumination channels for guiding illumination light partial beams towards the illumination field. A second facet mirror of the illumination optical unit is disposed downstream of the first facet mirror and has a plurality of facets. The latter respectively contribute to the imaging of a group of the individual mirrors of the first facet mirror into the object field via a group-mirror illumination channel. The latter comprises the individual-mirror illumination channels of the individual-mirror group. Images of the different individual-mirror groups are superimposed on one another in the object field via the assigned group-mirror illumination channels.

22 Claims, 7 Drawing Sheets

(51) Int. Cl.
*G03F 7/20* (2006.01)
*G02B 26/08* (2006.01)

(56) References Cited

U.S. PATENT DOCUMENTS

| | | | |
|---|---|---|---|
| 6,859,515 | B2 | 2/2005 | Schultz et al. |
| 8,497,977 | B2 * | 7/2013 | Kawabe .................. 355/67 |
| 2007/0030948 | A1 * | 2/2007 | Singer et al. ................ 378/34 |
| 2008/0013680 | A1 | 1/2008 | Singer et al. |
| 2009/0041182 | A1 | 2/2009 | Endres et al. |
| 2010/0231880 | A1 | 9/2010 | Kawabe |
| 2011/0001947 | A1 | 1/2011 | Dinger et al. |
| 2011/0063596 | A1 * | 3/2011 | Mann et al. ............... 355/67 |

FOREIGN PATENT DOCUMENTS

| | | |
|---|---|---|
| WO | WO 2008/149178 A1 | 12/2008 |
| WO | WO 2009/100856 A1 | 8/2009 |
| WO | WO 2010/037453 A1 | 4/2010 |
| WO | WO 2010/104163 A1 | 9/2010 |

OTHER PUBLICATIONS

German Office Action, with translation thereof, for corresponding DE Appl No. 10 2012 204 273.3, dated Nov. 12, 2012.

* cited by examiner

ILLUMINATION OPTICAL UNIT FOR EUV PROJECTION LITHOGRAPHY

CROSS-REFERENCE TO RELATED APPLICATIONS

The present application is a continuation of, and claims benefit under 35 USC 120 to, international application PCT/EP2013/054856, filed Mar. 11, 2013, which claims benefit under 35 USC 119 of German Application 10 2012 204 273.3, filed Mar. 19, 2012. International application PCT/EP2012/054856 also claims priority under 35 USC 119(e) to U.S. Provisional Application No. 61/612,450, filed Mar. 19, 2012. The entire disclosure of international application PCT/EP2013/054856 and German Application 10 2012 204 273.3 are incorporated by reference herein.

The invention relates to an illumination optical unit for EUV projection lithography for guiding illumination light towards an object field, in which a lithography mask can be arranged. The invention furthermore relates to an illumination system comprising such an illumination optical unit, a projection exposure apparatus comprising such an illumination system, a method for producing a micro- or nanostructured component, in particular a semiconductor chip, with the aid of such a projection exposure apparatus, and a micro- or nanostructured component produced by this method.

An illumination optical unit of the type mentioned in the introduction is known from WO 2010/037453 A1, WO 2010/104163 A1 and WO 2008/149178 A1 and from US 2011/0001947 A1.

The aim of the illumination is to superimpose the illumination light guided via different illumination channels of the illumination optical unit in the illumination field in a manner as free from losses as possible.

It is an object of the present invention to provide an illumination optical unit which provides an optimization of an illumination and, in particular, an optimized superimposition of the illumination light guided via different illumination channels in the illumination field.

This object is achieved according to the invention via an illumination optical unit for EUV projection lithography for guiding illumination light towards an object field in which a lithography mask can be arranged. The unit comprises a first facet mirror, which has a plurality of individual mirrors which provide individual mirror illumination channels for guiding illumination light partial beams towards the illumination field. The unit also comprises a second facet mirror, which is disposed down-stream of the first facet mirror in the beam path of the illumination light and has a plurality of facets which each contribute to the imaging of a group of the individual mirrors of the first facet mirror into the object field via a group-mirror illumination channel. The group mirror illumination channel comprises the individual mirror illumination channels of the individual mirror group. The arrangement of the individual mirrors of the first facet mirror and the arrangement of the facets of the second facet mirror are such that the images of the different individual mirror groups are superimposed on one another in the object field via the assigned group mirror illumination channels. The individual mirrors of the individual mirror groups are arranged such that imaging aberrations which occur depending on the respective assignment of the individual mirror groups of the first facet mirror on the one hand to the facets of the second facet mirror and on the other hand during the imaging of the individual mirror groups into the object field are at least partly compensated for. The object is also achieved via an illumination optical unit for EUV projection lithography for guiding illumination light towards an object field in which a lithography mask can be arranged. The unit comprises a first facet mirror, which has a plurality of individual mirrors which provide individual mirror illumination channels for guiding illumination light partial beams towards the illumination field. The unit also comprises a second facet mirror, which is disposed down-stream of the first facet mirror in the beam path of the illumination light and has a plurality of facets which each contribute to the imaging of a group of the individual mirrors of the first facet mirror into the object field via a group-mirror illumination channel. The group mirror illumination channel comprises the individual mirror illumination channels of the individual mirror group. The arrangement of the individual mirrors of the first facet mirror and the arrangement of the facets of the second facet mirror are such that the images of the different individual mirror groups are superimposed on one another in the object field via the assigned group mirror illumination channels. The individual mirrors of the individual mirror groups are oriented such that the individual mirror illumination channels of the individual mirror groups that are predefined thereby are guided towards different target locations on the facet of the second facet mirror that is assigned to the individual mirror group.

It has been recognized according to the invention that assignment imaging aberrations, which are therefore dependent on the course of the respective illumination channel of the illumination light guided via a respective individual-mirror group of the first facet mirror and then via a second facet of the second facet mirror, can be at least partly compensated for by a corresponding arrangement of the individual mirrors of the individual-mirror groups. The subdivision of the individual-mirror groups in each case into a plurality of individual mirrors makes such a compensation arrangement possible.

The individual mirrors of the individual mirror groups can be oriented such that the individual mirror illumination channels of the individual mirror groups that are predefined thereby are guided towards different target locations on the facet of the second facet mirror that is assigned to the individual mirror group. Such an orientation of the individual mirrors constitutes a variant of such a compensation arrangement. The orientation of the individual mirrors towards different target locations on the assigned facet of the second facet mirror has effects on the form of an image of the individual mirror group which is used for the compensation of imaging aberrations. The orientation can be brought about by individual tilting of the individual mirrors within the respective individual-mirror group. A distance between the target location of a respective individual mirror and a centre of the assigned facet of the second facet mirror can be uniquely assigned to a position of the individual mirror within the individual mirror group. With respect to a spatial coordinate that can be used to specify the position of the individual mirrors within the respective individual mirror group, the distance dependence of the target location on the centre of the facet of the second facet mirror can be such that the further the individual mirror within the individual mirror group is arranged marginally with respect to the spatial coordinate, the greater the distance between the target location assigned to the individual mirror and the centre of the assigned facet of the second facet mirror. In particular, there can be a proportional and in a particular a linear relationship between the spatial coordinate and the distance between the target location and the midpoint or the centre of the facet of the second facet mirror.

An orientation of the individual mirrors as described above can provide for an optimization of a field illumination independently of possible assignment dependent imaging aberrations.

The individual mirrors can be oriented such that the different target locations on the facet of the second facet mirror towards which the individual mirror illumination channels are guided are arranged along a target location path running over the facet. Such an arrangement of the target locations of the individual mirror illumination channels on a target location path facilitates the predefinition of a functional relationship between the location of the individual mirror within the individual mirror group and the orientation or tilting of the individual mirror such that a desired target location on the assigned facet of the second facet mirror is achieved.

The individual mirrors can be arranged such that the target location path runs rectilinearly. Such a target location path course simplifies the orientation assignment. Alternatively, a curved target location path course is also possible.

Reflection surfaces of the facets of the second facet mirror can have a larger extent along the target location path than perpendicularly thereto. The second facet mirror can have facets having extents that differ in terms of their extent along the target location path. Such surface designs for the facets of the second facet mirror are adapted to the orientation compensation. Insofar as facets of the second facet mirror having hexagonal reflection surfaces are used, a larger extent of the reflection surfaces of the facets along the target location path can be achieved in a simple manner by the hexagonal reflection surfaces being oriented such that mutually opposite roof edges of the hexagonal shape are arranged along the target location path. Correspondingly, it is possible e.g. also to arrange square facets of the second facet mirror by tilting by 45° with roof edges or corners situated opposite one another along the target location path. Facets of the second facet mirror can be embodied in a manner adapted to the respective target location variation requirements for the compensation of imaging aberrations. Therefore, not all of the second facets need be embodied with extents that differ in the same way, that is to say with an identical aspect ratio. Second facets that are not subjected to different illumination channel target locations can furthermore be designed with an aspect ratio of one. Depending on the maximum distance of the target locations of the illumination channels on the facet of the second facet mirror, the facet can be designed with a corresponding aspect ratio. A larger extent of the facets of the second facet mirror along the target location path can be chosen such that furthermore the largest possible number of facets of the second facet mirror can be accommodated within an area element. If the facets of the second facet mirror deviate from rotational symmetry with regard to their edge contour, an adaptation of the orientation of the facets of the second facet mirror such that the diameter of the second facets is larger along the target location path than perpendicularly thereto often suffices.

The object field is spanned by two object field coordinates. The individual mirrors of an individual mirror group which belong to the same coordinate value of one of the two object field coordinates, that is to say differ only in the other object field coordinate, can be oriented such that the individual mirror illumination channels of the individual mirrors that are predefined thereby are guided towards the same target location on the facet of the second facet mirror that is assigned to the individual mirror group. In such a case of an assignment, it is possible to realize an imaging superimposing shear effect of the form of the individual mirror group in which the individual mirrors which belong to the same coordinate value with regard to one of the two object field coordinates are imaged in the same way, wherein other individual mirrors of the same individual mirror group can, by contrast, be allocated a shifting effect for the individual mirror image. On account of the shifting effect, a shear effect then arises for the image of the individual mirror group, which can be used for optimizing the superimposition of the images of the different individual mirror groups in the illumination field.

The spatial arrangement of the individual mirrors on the first facet mirror can be selected such that a size and/or edge contour of the individual mirror group on the first facet mirror taking account of the imaging scale of the imaging of the individual mirror group into the object field deviate(s) from a size and/or edge contour of the object field such that this deviation compensates for the imaging aberrations. Such a spatial arrangement constitutes a variant of a compensation arrangement. Here, the size or the form or edge contour of the individual mirror group is predefined in a targeted manner such that the size or form precisely compensates for the subsequent illumination channel assignment dependent imaging aberration during the imaging of the individual mirror group into the object field. In principle, having available a corresponding deviation of a size and/or edge contour of the individual mirror group in comparison with the object field can also be linked in any desired combination with the other features that have already been discussed above.

The advantages of an illumination system including such an illumination optical unit, of a projection exposure apparatus including such an illumination system, of a production method of using such a projection exposure apparatus, and of a micro or nanostructured component made by such a method correspond to those which have already been explained above with reference to the illumination optical unit according to the invention. In a projection exposure apparatus, the target location path can run parallel to the displacement direction. Such an orientation of the target location path can make it possible to simplify an adjustment of the illumination optical unit within the projection exposure apparatus. The component made by the production method can be produced with high structural resolution. In this way it is possible, for example, to produce a semiconductor chip having a high integration or storage density.

Exemplary embodiments of the invention are explained in greater detail below with reference to the drawing, in which.

Figure 1:
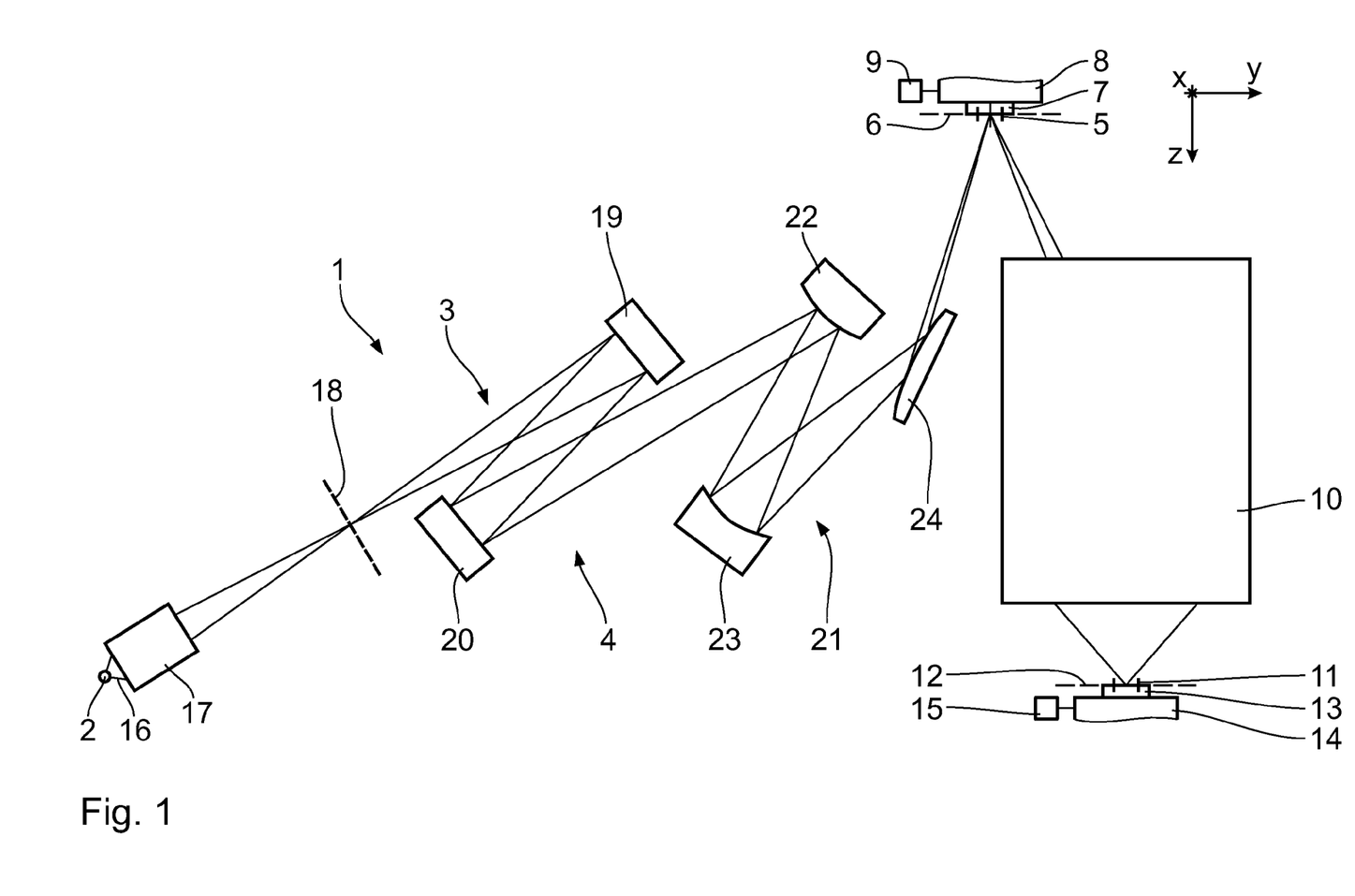
FIG. 1 schematically shows a meridional section through a projection exposure apparatus for EUV projection lithography.

FIG. 1 schematically shows in a meridional section a projection exposure apparatus 1 for microlithography. The projection exposure apparatus 1 includes a light or radiation source 2. An illumination system 3 of the projection exposure apparatus 1 has an illumination optical unit 4 for exposing an illumination field coinciding with an object field 5 in an object plane 6. The illumination field can also be larger than the object field 5. In this case, an object in the form of a reticle 7 arranged in the object field 5, the reticle being held by an object or reticle holder 8, is exposed. The reticle 7 is also designated as a lithography mask. The object holder 8 is displaceable along a displacement direction via an object displacement drive 9. A projection optical unit 10 serves for imaging the object field 5 into an image field 11 in an image plane 12. A structure on the reticle 7 is imaged onto a light-sensitive layer of a wafer 13 arranged in the region of the image field 11 in the image plane 12. The wafer 13 is held by a wafer holder 14 (likewise not illustrated). The wafer holder 14 is likewise displaceable along the displacement direction in a manner synchronized with the object holder 8 via a wafer displacement drive 15.

The radiation source 2 is an EUV radiation source having an emitted used radiation in the range of between 5 nm and 30 nm. This can be a plasma source, for example a GDPP (gas discharge-produced plasma) source or an LPP (laser-produced plasma) source. A radiation source based on a synchrotron or on a free electron laser (FEL) can also be used for the radiation source 2. Information about such a radiation source can be found by the person skilled in the art for example from U.S. Pat. No. 6,859,515 B2. EUV radiation 16 emerging from the radiation source 2 is concentrated by a collector 17. A corresponding collector is known from EP 1 225 481 A. Downstream of the collector 17, the EUV radiation 16 propagates through an intermediate focal plane 18 before it impinges on a field facet mirror 19. The field facet mirror 19 is a first facet mirror of the illumination optical unit 4. The field facet mirror 19 has a multiplicity of individual mirrors (not illustrated in FIG. 1). The field facet mirror 19 is arranged in a plane of the illumination optical unit 4 which is optically conjugate with respect to the object plane 6.

The EUV radiation 16 is also designated hereinafter as illumination light or as imaging light.

Downstream of the field facet mirror 19, the EUV radiation 16 is reflected by a pupil facet mirror 20. The pupil facet mirror 20 is a second facet mirror of the illumination optical unit 4. The pupil facet mirror 20 is arranged in a pupil plane of the illumination optical unit 4, which is optically conjugate with respect to the intermediate focal plane 18 and with respect to a pupil plane of the projection optical unit 10 or coincides with the pupil plane. The pupil facet mirror 20 has a plurality of pupil facets (not illustrated in FIG. 1). With the aid of the pupil facets of the pupil facet mirror 20 and a downstream imaging optical assembly in the form of a transfer optical unit 21 comprising mirrors 22, 23 and 24 designated in the order of the beam path, individual-mirror groups 24a (cf. FIG. 7) of the field facet mirror 19, which are described in even greater detail below, are imaged into the object field 5. The last mirror 24 of the transfer optical unit 21 is a mirror for grazing incidence ("grazing incidence mirror").

In order to facilitate the description of positional relationships, FIG. 1 depicts a Cartesian xyz coordinate system as a global coordinate system for the description of the positional relations of components of the projection exposure apparatus 1 between the object plane 6 and the image plane 12. The x-axis runs perpendicularly to the plane of the drawing into the latter in FIG. 1. The y-axis runs towards the right and parallel to the displacement direction of the object holder 8 and of the wafer holder 14 in FIG. 1. The z-axis runs downwards in FIG. 1, that is to say perpendicularly to the object plane 6 and the image plane 12.

The x-dimension over the object field 5 or the image field 11 is also designated as the field height.

Figure 2:
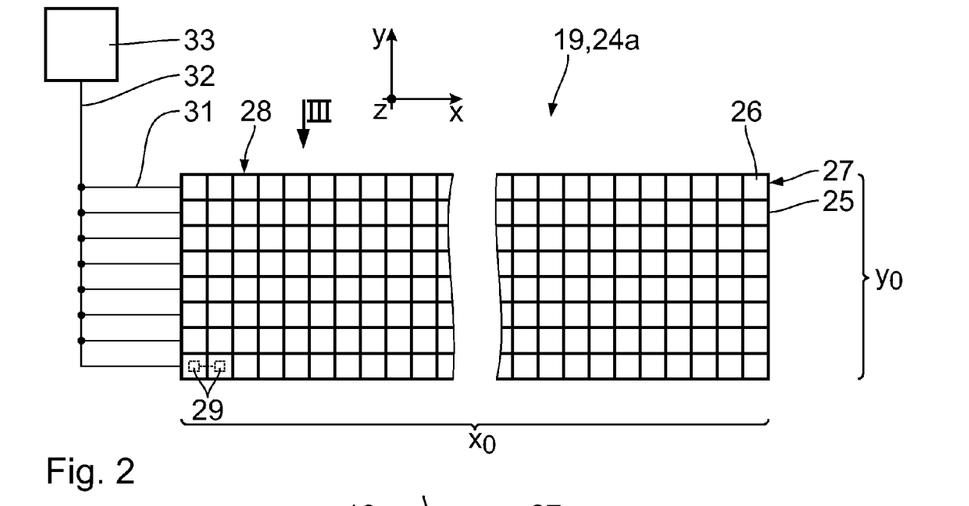
FIG. 2 schematically shows a plan view of an excerpt from a field facet mirror—constructed from individual mirrors—of an illumination optical unit for illuminating an object field, suitable for use in the projection exposure apparatus according to FIG. 1.

FIG. 2 shows details of the construction of an excerpt from the field facet mirror 19 in a highly schematic illustration. The excerpt from the field facet mirror 19 as illustrated in FIG. 2 can be exactly one of the individual-mirror groups 24a. An entire reflection surface 25 of the field facet mirror 19 is subdivided in rows and columns into a grid of individual mirrors 26. Partial beams of the illumination light 16 are guided via the respective individual mirrors 26. The individual reflection surfaces of the specific individual mirrors 26 are planar and have no curvature. An individual-mirror row 27 has a plurality of the individual mirrors 26 situated directly alongside one another. Tens to hundreds of the individual mirrors 26 can be provided in an individual-mirror row 27. In the example according to FIG. 2, the individual mirrors 26 are square. Other shapes of individual mirrors which enable the reflection surface 20 to be covered as far as possible without any gaps can also be used. Such alternative individual-mirror shapes are known from the mathematical theory of parqueting. In this connection, reference should be made to the references indicated in WO 2009/100 856 A1.

Depending on the embodiment of the field facet mirror 19, an individual-mirror column 28 likewise has a plurality of the individual mirrors 26. By way of example, a few, a few tens or a few hundreds of the individual mirrors 26 are provided per individual-mirror column 28.

In order to facilitate the description of positional relationships, FIG. 2 depicts a Cartesian xyz coordinate system as a local coordinate system of the field facet mirror 19. Corresponding local xyz coordinate systems are also found in the subsequent figures shown in facet mirrors or an excerpt therefrom in plan view. In FIG. 2, the x-axis runs horizontally towards the right parallel to the individual-mirror rows 27. The y-axis runs upwards parallel to the individual-mirror columns 28 in FIG. 2. The z-axis is perpendicular to the plane of the drawing in FIG. 2 and runs out of the latter.

The y-direction of the global coordinate system according to FIG. 1, that is to say the displacement direction for the reticle 7 and the wafer 13, and the y-direction of the local coordinate system according to FIG. 2, that is to say the column direction of the individual-mirror array, need not run exactly parallel to one another, but rather can assume a, for example small, angle with respect to one another.

In the x-direction, the reflection surface 25 of the individual-mirror group 24$a$ has an extent of $x_0$. In the y-direction, the reflection surface 25 of the individual-mirror group 24$a$ has an extent of $y_0$.

Depending on the embodiment of the field facet mirror 19, the individual mirrors 26 have x/y extents in the range of, for example, from 500 µm×500 µm to, for example, 2 mm×2 mm. The individual mirrors 26 can be shaped such that they have a concentrating effect for the illumination light 16. Such a concentrating effect of the individual mirrors 26 is advantageous particularly when using divergent illumination of the field facet mirror 19 with the illumination light 16. The entire field facet mirror 19 has an $x_0/y_0$ extent which, depending on the embodiment, is, for example, 300 mm×300 mm or 600 mm×600 mm. The individual-mirror groups 24$a$ (cf. FIG. 7) have typical x/y extents of 80 mm×6 mm or of 65 mm×5 mm or of 25 mm×4 mm or of 104 mm×8 mm. Depending on the ratio between the size of the respective individual-mirror groups 24$a$ and the size of the individual mirrors 26 from which the individual-mirror groups 24$a$ are constructed, each of the individual-mirror groups 24$a$ has a corresponding number of individual mirrors 26.

Figure 3:
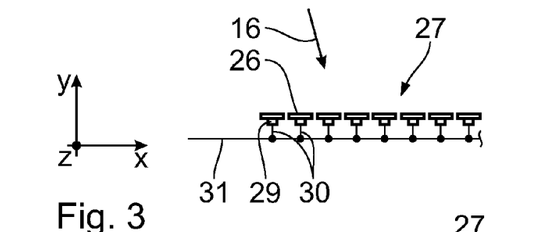
FIG. 3 shows a view of an excerpt from an individual-mirror row of the facet mirror according to FIG. 2 from viewing direction III in FIG. 2.

For the individual deflection of impinging illumination light 16, each of the individual mirrors 26 is respectively connected to an actuator 29, as indicated by dashed lines in FIG. 2 on the basis of two individual mirrors 26 arranged in a corner at the bottom left of the reflection surface 25, and as illustrated in greater detail in FIG. 3 on the basis of an excerpt from an individual-facet row 27. The actuators 29 are arranged on that side of each of the individual mirrors 26 which faces away from a reflective side of the individual mirrors 26. The actuators 29 can be embodied as piezo-actuators, for example. Configurations of such actuators are known from the construction of micromirror arrays.

The actuators 29 of an individual-mirror row 27 are respectively connected via signal lines 30 to a row signal bus 31. An individual-mirror row 27 is assigned in each case to one of the row signal buses 31. The row signal buses 31 of the individual-mirror rows 27 are connected, for their part, to a main signal bus 32. The latter is signal-connected to a control device 33 of the field facet mirror 19. The control device 33 is designed, in particular, for driving the individual mirrors 26 jointly in a serial fashion, that is to say row by row or column by column. Individual driving of the individual mirrors 26 is possible even within the individual-mirror rows 27 and the individual-mirror columns 28.

Each of the individual mirrors 26 can be tilted individually independently about two mutually perpendicular tilting axes, wherein a first of the tilting axes runs parallel to the x-axis and the second of these two tilting axes runs parallel to the y-axis. The two tilting axes lie in the individual reflection surfaces of the respective individual mirrors 26.

In addition, an individual displacement of the individual mirrors 26 in the z-direction is also possible via the actuators 29. The individual mirrors 26 are therefore displaceable in a drivable manner separately from one another along a normal to the reflection surface 25. As a result, the topography of the reflection surface 25 overall can be changed. This is illustrated highly schematically by way of example with reference to FIGS. 4 to 6. It is thereby possible to produce even contours of the reflection surface having large sagittas, that is to say large variations in the topography of the reflection surface, in the form of mirror segments arranged overall in one plane in the manner of Fresnel lenses. A basic curvature of such a mirror surface topography having a large sagitta is eliminated by such subdivision into segments in the manner of Fresnel zones.

Figure 4:
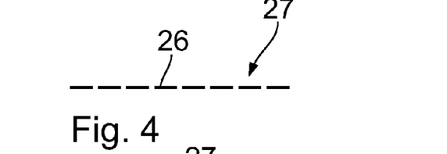
FIGS. 4 to 6 show highly schematically different forms of a row reflection surface formed from the individual mirrors of the individual-mirror row illustrated in FIG. 3, in three different configurations.

FIG. 4 shows individual reflection surfaces of the individual mirrors 26 of an excerpt from an individual-mirror row 27, wherein all the individual mirrors 26 of the individual-mirror row 27 are put into the same absolute z-position via the control device 33 and the actuators 29. This results in a planar row reflection surface of the individual-mirror row 27. If all the individual mirrors 26 of the field facet mirror 19 are oriented in accordance with FIG. 4, the entire reflection surface 25 of the field facet mirror 19 is planar.

Figure 5:
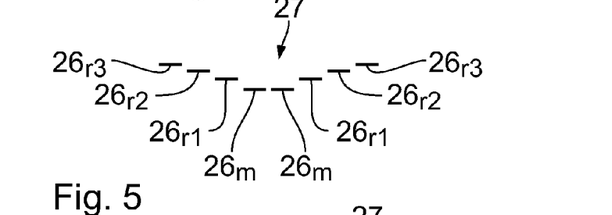

FIG. 5 shows driving of the individual mirrors 26 of the individual-mirror row 27, in which the central individual mirror $26_m$ is set in a manner offset in the negative z-direction relative to adjacent individual mirrors $26_{r1}$, $26_{r2}$, $26_{r3}$. This results in a stepped arrangement that leads to a corresponding phase offset of the EUV radiation 16 impinging on the individual-mirror row 27 according to FIG. 5. In this case, the EUV radiation 16 reflected from the two central individual mirrors $26_m$ is phase-delayed to the greatest extent. The marginal individual mirrors $26_{r3}$ generate the least phase delay. The intervening individual mirrors $26_{r1}$, $26_{r2}$ correspondingly generate in a stepwise manner a phase delay that becomes increasingly less proceeding from the phase delay as a result of the central individual mirrors $26_m$.

Figure 6:
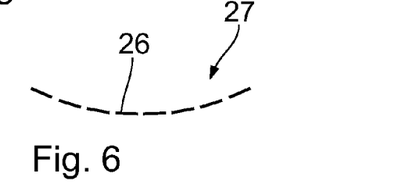

FIG. 6 shows driving of the individual mirrors 26 of the illustrated excerpt from the individual-mirror row 27 in such a way that the offset of the individual mirrors 26 relative to one another in the z-direction, on the one hand, and the orientation of the individual mirrors 26 with respect to one another, on the other hand, result overall in a convexly shaped individual-mirror row 27. This can be used to produce an imaging effect of individual-mirror groups of the field facet mirror 19. In the same way, of course, for example a concave arrangement of groups of the individual mirrors 26 is also possible.

Corresponding designs, as explained above with reference to FIGS. 5 and 6, are not restricted to the x-dimension, but rather, depending on the driving via the control device 33, can also be continued over the y-dimension of the field facet mirror 19.

A predefined tilting grouping of the individual mirrors 26 in the individual-mirror groups 24$a$ each composed of at least two individual mirrors 26, as already mentioned above, can be set by the individual driving of the actuators 29 via the control device 33. The individual-mirror groups 24$a$ are respectively assigned via at least one dedicated group-mirror illumination channel for the illumination light 16 to at least one dedicated pupil facet of the pupil facet mirror 20 for imaging the individual-mirror group 24a into the object field 5. This assignment is effected by predefinition of the respective tilting position or switching position of the individual mirrors 26 belonging to the individual-mirror group 24a in such a way that the partial beam of the illumination light 16 which impinges on the respective individual mirror 26 is reflected from this individual mirror 26 towards the assigned pupil facet of the pupil facet mirror 20 and from there towards the object field 5. In this case, the group-mirror illumination channel is the totality of all the individual-mirror illumination channels of the respective individual-mirror group 24a which complement one another on account of the imaging via the pupil facet for illuminating the entire illumination or object field 5. Each of the individual-mirror groups 24a can therefore be regarded as an original image of the illumination field 5. In this case, the original image of the illumination field 5 is that structural form which is imaged exactly into the illumination field 5, taking account of the imaging aberrations. This structural form is also designated as the actual original image. In contrast thereto, the ideal original image of the illumination field 5 denotes that structural form which is imaged exactly into the illumination field 5 without taking account of imaging aberrations.

The total illumination of the illumination or object field 5 then constitutes a superposition of these original images.

Each of the individual-mirror groups 24a therefore respectively has the function of a facet of a field facet mirror such as is disclosed for example in U.S. Pat. No. 6,438,199 B1 or U.S. Pat. No. 6,658,084 B2.

Figure 7:
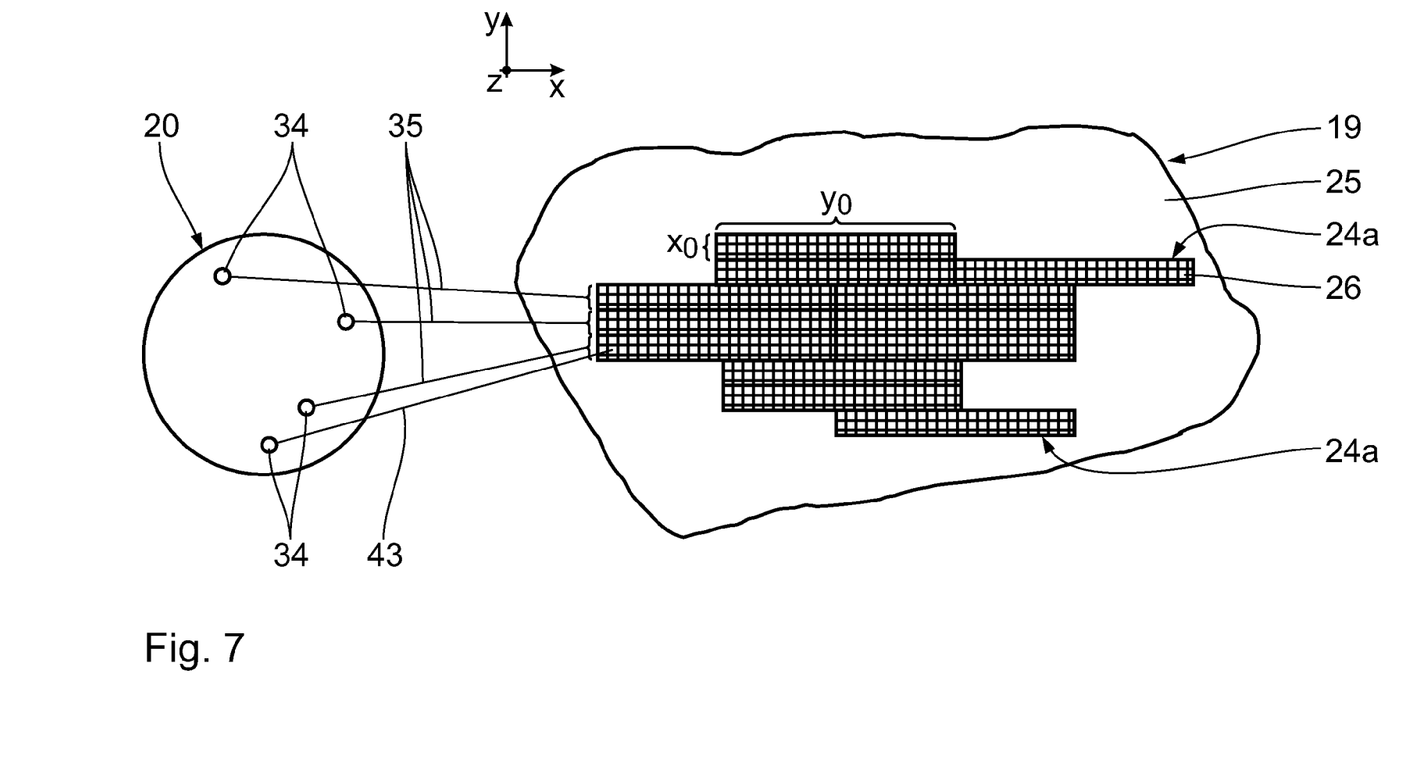
FIG. 7 shows a plan view of an excerpt from an embodiment of a field facet mirror constructed from individual mirrors with an exemplary grouping of the individual mirrors into an arrangement of individual-mirror groups, the figure also indicating by way of example an assignment of some of the individual-mirror groups to second facets of a second facet mirror, likewise illustrated in a plan view on the left in FIG. 7, via group-mirror illumination channels.

FIG. 7 illustrates such a grouping. The illustration shows an excerpt from the reflection surface 25 of a field facet plate of a variant of the field facet mirror 19 having a larger number of individual mirrors 26 in comparison with the illustration according to FIG. 2. Components corresponding to those which have already been explained above with reference to FIGS. 2 to 6 bear the same reference numerals and will not be discussed in specific detail again.

Through corresponding combination of the drivings by the control device 33, a total of twelve individual-mirror groups 24a are formed within the reflection surface 25 in the case of the example in FIG. 7. The individual-mirror groups 24a each have the same x/y aspect ratio. Each of the individual-mirror groups 24a consists of a 24×3 array of individual mirrors 26, that is to say has three individual-mirror rows each having twenty-four individual mirrors 26. Each of the individual-mirror groups 24a therefore has an aspect ratio of 8 to 1. This aspect ratio corresponds to the aspect ratio of the object field 5 to be illuminated. Differences in aspect ratio which occur on account of detail changes during the imaging of the respective individual-mirror group 24a into the object field 5 on account of a change in the ray geometry depending on the tilting position of the individual mirrors 26 are disregarded in this case.

Within each of the individual-mirror groups 24a, the individual mirrors 26 are oriented with respect to one another in such a way that the form of each of the individual-mirror groups 24a corresponds to the form of an individual field facet of a conventional field facet mirror. The images of the individual mirrors 26 of the respective individual-mirror group 24a complement one another in the object field 5 with respect to the entire object field 5.

FIG. 7 schematically shows an assignment of three of the individual-mirror groups 24a via group-mirror illumination channels 35 to three pupil facets 34 of the pupil facet mirror 20. The pupil facets 34 constitute second facets of the illumination optical unit 4.

Figure 8:
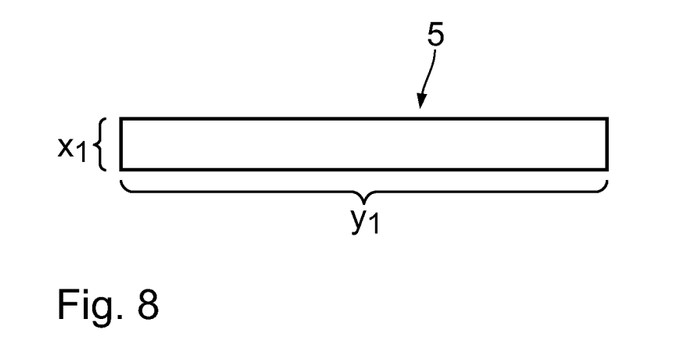
FIG. 8 shows an example of an object field in a schematic plan view, wherein the object field is embodied in a rectangular fashion.
Figure 9:
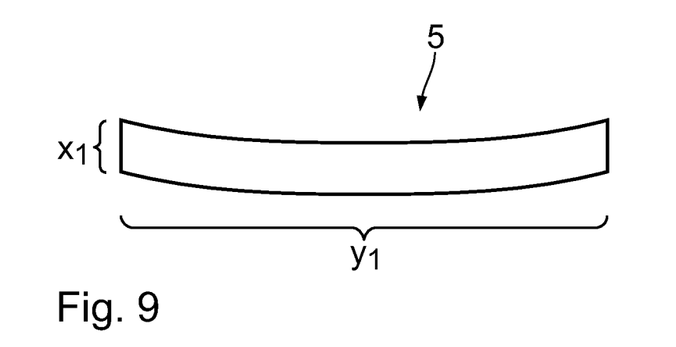
FIG. 9 shows a further example of an object field in an illustration similar to FIG. 8, wherein the object field is configured in an arcuate fashion.

FIGS. 8 and 9 show two possible variants for the boundary form of the object field 5. The object field 5 according to FIG. 8 is rectangular with an aspect ratio $x_1/y_1$. The object field 5 according to FIG. 9 is arcuate with the same aspect ratio $x_1/y_1$.

Figure 10:
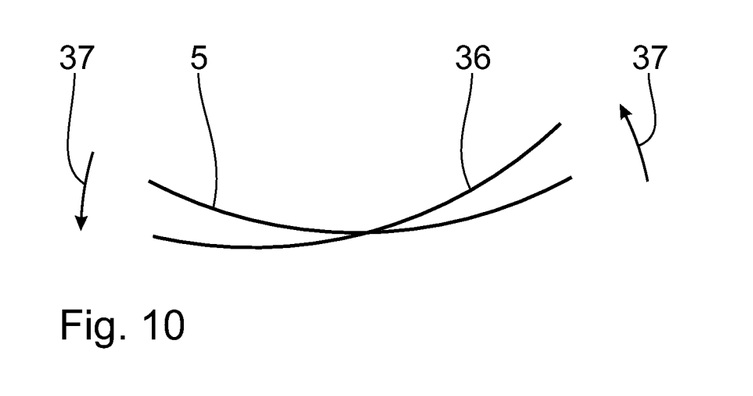
FIG. 10 shows, in a schematic illustration, a tilting aberration during the imaging of an individual-mirror group of the field facet mirror in an object plane, wherein the tilting imaging aberration occurs depending on a respective channel assignment of the individual-mirror group of the first facet mirror to facets of the second facet mirror.

FIG. 10 illustrates the effects of an imaging aberration during the imaging of an individual-mirror group 24a into the object field 5 on the basis of the example of an arcuate object field 5 in accordance with FIG. 9. The object field 5 is indicated schematically by an arc in FIG. 10. Shown tilted with respect thereto is an individual-mirror-group image 36 of an individual-mirror group 24a, which image is not compensated for with regard to a tilting imaging aberration. The tilting by a tilting angle in the anticlockwise direction in FIG. 10 (cf. direction arrow 37) is shown in a greatly exaggerated manner in FIG. 10. This tilting imaging aberration is dependent on a respective assignment of the individual-mirror group 24a to the pupil facet 34.

The schematic imaging-aberration illustration according to FIG. 10 applies to arcuately designed individual-mirror groups (cf. FIG. 11) or to rectangular individual-mirror groups 24a (cf. FIGS. 2 and 7), in which an additional arcuate field shaping takes place e.g. via the correspondingly designed grazing incidence mirror 24.

Figure 11:
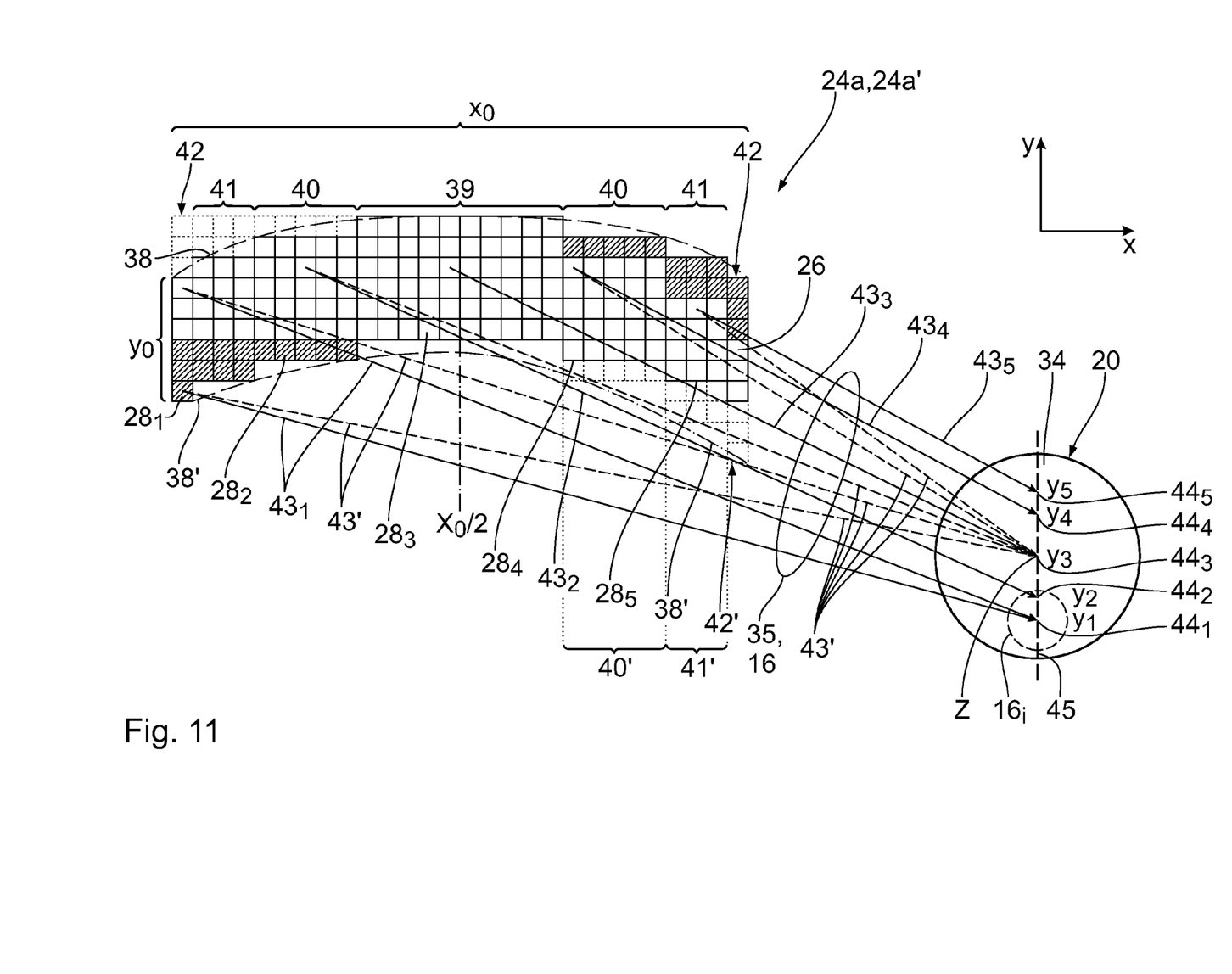
FIG. 11 shows, in an illustration similar to FIG. 7, an individual-mirror group of the first facet mirror and an assigned facet of the second facet mirror, wherein the individual mirrors of the first facet mirror are oriented such that beam axes of beam paths of individual-mirror illumination channels of the individual-mirror group are guided towards different target locations on the assigned facet of the second facet mirror, wherein an alternative spatial, regrouped arrangement of the individual mirrors of the individual-mirror group, which likewise leads to an imaging-aberration-compensating effect, is illustrated in a dashed manner.

Two alternative possibilities for compensation of the assignment imaging aberration in accordance with FIG. 10 are explained below with reference to FIG. 11. This takes place on the basis of a basically arcuately designed individual-mirror group 24a, which is shown with individual mirrors 26 illustrated using solid lines in FIG. 11. The individual-mirror group 24a according to FIG. 11 is formed as a 30×6 grid composed of correspondingly selected individual mirrors 26 of the field facet mirror 19. An arcuate edge contour 38 arises as a result of a corresponding gradation of the selected individual mirrors 26. In the region of medium field heights, that is to say at $x_0/2$, the individual-mirror group 24a according to FIG. 11 has a rectangular 10×6 central array 39 composed of the individual mirrors 26. Adjoining the central array 39 on the right and left in the x-direction, the individual-mirror group 24a has two first side arrays 40, adjacent to which there are firstly two second side arrays 41 in the positive and negative x-direction and then two edge arrays 42 marginally in the positive and negative x-direction. The first side arrays are embodied as 4×6 arrays. The second side arrays are embodied as 3×6 arrays. The two edge arrays 42 are embodied as 1×6 arrays.

The two first side arrays 40 are offset in the negative y-direction by one individual-mirror grid, that is to say by the extent of one of the individual mirrors 26 in the y-direction, relative to the central array 39. The two second side arrays 41 are in turn offset in the negative y-direction by one individual-mirror grid relative to the two first side arrays 40. The two edge arrays 42 are in turn offset in the negative y-direction by one individual-mirror grid relative to the two second side arrays 41.

The individual mirrors 26 of the individual-mirror group 24a are arranged, namely tilted individually with respect to one another, such that the tilting imaging aberration that was illustrated above with reference to FIG. 10 is compensated for. For this purpose, the individual mirrors 26 are tilting-oriented such that beam axes of beam paths of individual-mirror illumination channels 43 of the individual-mirror group 24a are guided towards different target locations 44 on the facet 34 of the pupil facet mirror 20 that is assigned to the individual-mirror group 24a. In this case, the position of the respective target location 44 is dependent on the x-coordinate of the position of the individual mirror 26 within the individual-mirror group 24a. The individual-mirror illumination channels $43_1$ to $43_5$ of selected individual mirrors 26 in the individual-mirror columns 28 are illustrated using solid lines in FIG. 11. Illumination light partial beams 16, run along the individual-mirror illumination channels $43_i$.

The illumination channels $43_i$ belong to the individual mirrors 26 of the individual-mirror column $28_1$, which coincides with the edge array 42 on the left in FIG. 11. The illumination channels $43_2$ belong to the individual mirrors 26 in the individual-mirror column $28_2$, the middle column of the first side array 40 on the left in FIG. 11. The individual-mirror illumination channels $43_3$ belong to the individual mirrors 26 in the individual-mirror column $28_3$, one of the two middle individual-mirror column 28 of the central array 39. The individual-mirror illumination channels $43_4$ belong to the individual mirrors 26 of the individual-mirror column $28_4$, the— in FIG. 11—left individual-mirror column 28 of the first side array 40 on the right in FIG. 11. The individual-mirror illumination channels $43_5$ belong to the individual mirrors 26 of the individual-mirror column $28_5$, the middle individual-mirror column 28 of the second side arrays 41, on the right in FIG. 11, of the individual-mirror group 24a.

Depending on the x-coordinate of the individual mirror 26 of the individual-mirror group 24a according to FIG. 11, the target location 44 lies at a different y-coordinate on the pupil facet 34. The target locations $44_1$ of all the individual mirrors 26 of the individual-mirror column $28_1$ coincide at a first, smallest y-coordinate $y_1$ on the pupil facet 34. The target locations $44_2$ of all the individual mirrors 26 of the individual-mirror column $28_2$ coincide on the pupil facet 34 at a second y-coordinate $y_2$, which is greater than $y_1$. The target locations $44_3$ of the individual mirrors 26 of the individual-mirror column $28_3$ coincide on the pupil facet 34 at a third y-coordinate $y_3$, the centre of the pupil facet 34, which is greater than the y-coordinate $y_2$. The target locations $44_4$ of the individual mirrors 26 of the individual-mirror column $28_4$ coincide at a y-coordinate $y_4$, which is greater than $y_3$. The target locations $44_5$ of the individual mirrors 26 of the individual-mirror column $28_5$ coincide on the pupil facet 34 at a y-coordinate $y_5$, which is greater than $y_4$. The target locations $44_1$ to $44_5$ lie on a target-location path 45, which runs parallel to the y-direction at $y_3$ through a centre of the pupil facet 34. The target locations of the other individual-mirror columns 28, lie between the target locations $y_1$ and $y_5$ on the target-location path 45 such that a linear relationship arises between the x-coordinate of the individual-mirror column 28, and the y-coordinate of the target location $44_i$.

The illumination light partial beams 16, assigned to the individual-mirror illumination channels 43, have such a small diameter on the pupil facet mirror 34 that even the illumination light partial beams 16 which impinge on the pupil facet 34 at the marginal target locations $44_1$ and $44_5$ with regard to the y-coordinate are completely reflected by the pupil facet.

The target-location path 45 runs rectilinearly. Alternatively, a course of the target-location path 45 that is curved or led in some other way is also possible.

The individual mirrors 26 of the individual-mirror group 24a according to FIG. 11 which in each case have the same x-coordinate value, and differ only in the y-coordinate value, are oriented such that the beam axes of the beam paths of the individual-mirror illumination channels 43, of the individual mirrors 26 are in each case guided towards the same target location 44, on the facet 34 of the second facet mirror 42 that is assigned to the individual-mirror group 24a. This therefore results in a target-location assignment of the individual mirrors 26 to the target locations 44, depending on the x-coordinate value of the individual mirror 26 within the individual-mirror group 24a. In particular, there is a linear relationship between the y-coordinate of the target location 44, and the x-coordinate of the individual mirror 26. If the individual mirrors 26 of the individual-mirror group 24a according to FIG. 1 are arranged between the coordinate values $[-x_0/2; +x_0/2]$, for example the distance between the target location 44, and the centre or midpoint Z of the facet 34 can be linearly dependent on the x-coordinate value.

A corresponding assignment of the individual mirrors to the target locations 44, is possible even if the individual mirrors 26 are not arranged in an x/y grid, as indicated in FIGS. 2, 7 and 11. Instead of a column association, those individual mirrors 26 which belong to the same x-coordinate value are then assigned to the same target location $44_i$. An association of an individual mirror 26 with the same x-coordinate value is provided when the individual mirror 26 respectively considered overlaps at least the predefined x-coordinate value. An "individual-mirror column" is then understood to mean those individual mirrors 26 which belong to the same x-coordinate value.

Figure 12:
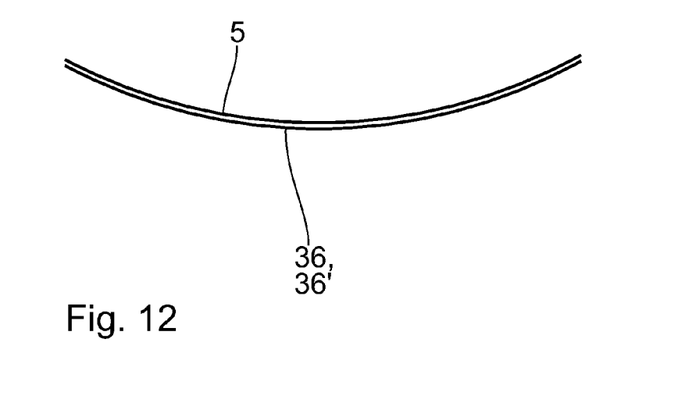
FIG. 12 shows, in an illustration similar to FIG. 10, the compensating effect of the arrangement of the individual mirrors of the first facet mirror oriented or regrouped according to FIG. 11.

FIG. 12 illustrates the effect of this target-location assignment: on account of the y-offset of the target locations $44_1$ to $44_5$ on the pupil facet 34, a different y-deflection of the various individual-mirror columns $28_i$ arises in the y-direction. This deflecting effect is chosen, then, such that the tilting imaging aberration in accordance with FIG. 10 is precisely compensated for. As a result, the individual-mirror-group image 36 coincides with the arcuate object field 5. This effect of the target-location assignment is also designated as shear.

An arrangement variant of the individual mirrors 26 belonging to an individual-mirror group 24a is also illustrated in a dashed manner in FIG. 11. This variant is also designated as edge contour compensation. This alternative arrangement variant involves implementing a different selection of the individual mirrors 26 which are assigned to the individual-mirror group, which is designated by 24a' in the arrangement variant illustrated in a dashed manner. This alternative individual-mirror group 24a' is also designated as a sheared individual-mirror group. This arrangement or assignment of the individual mirrors 26 with respect to the individual-mirror group 24a' in this compensation alternative is such that the edge contour 38', which is indicated in a dash-dotted manner for the lower right half of the alternative individual-mirror group 24a', deviates from the arcuate edge contour of the object field 5 (cf. FIG. 9) such that this edge contour deviation compensates for the deviation of the tilting imaging aberration in accordance with FIG. 10.

For this purpose, the entire left half, in FIG. 11, of the alternative individual-mirror group 24a' is embodied as a rectangular 14×6 array. Adjacent thereto without being offset in the y-direction is the right half of the central array 39 in the positive x-direction in the form of a 5×6 array. The first side array 40' on the right in FIG. 11 is offset in the negative y-direction by a further individual-mirror grid relative to the right side array 40 of the arrangement variant described first, such that the offset between the central array 39 and the first side array 40' on the right now amounts to two individual-mirror grids in the negative y-direction. The further arrays adjoining the first side array 40', that is to say the second side array 41' and the right edge array 42', are also for their part each offset further in the negative y-direction by a further individual-mirror grid, such that the second side array 41' is offset in the negative y-direction by two individual-mirror grids relative to the first side array 40' and the right edge array 42' is also offset in the negative y-direction by two individual-mirror grids relative to the second side array 41'.

In the case of this alternative arrangement or assignment, the beam axes of beam paths of the individual-mirror illumination channels 43' of the alternative individual-mirror group 24a' are guided to the same target location Z, that is to say to the centre, of the pupil facet 34. A compensation of the tilting imaging aberration in accordance with FIG. 10 results if the individual mirrors 26 are assigned to the sheared individual-mirror group 24a', that is to say exclusively on account of the sheared arrangement, which brings about a precompensation of the tilting imaging aberration. In the case of the sheared individual-mirror group 24a', too, the result is an individual-mirror-group image 36' that coincides with the object field 5, as illustrated in FIG. 12.

A mixing of the tilting effect on account of the target-location assignment, on the one hand, and the shear effect on account of the alternative sheared arrangement of the individual mirrors 26 is also possible.

The shear of the individual-mirror columns 28, with respect to one another is illustrated in an exaggerated manner in FIG. 11 on account of the exaggerated relative size of the individual mirrors 26 with respect to the size of the individual-mirror group 24a'. Since the individual-mirror group 24a' is actually constructed from a very much larger number of individual mirrors 26, smaller and subtler shear designs can be realized.

Figure 13:
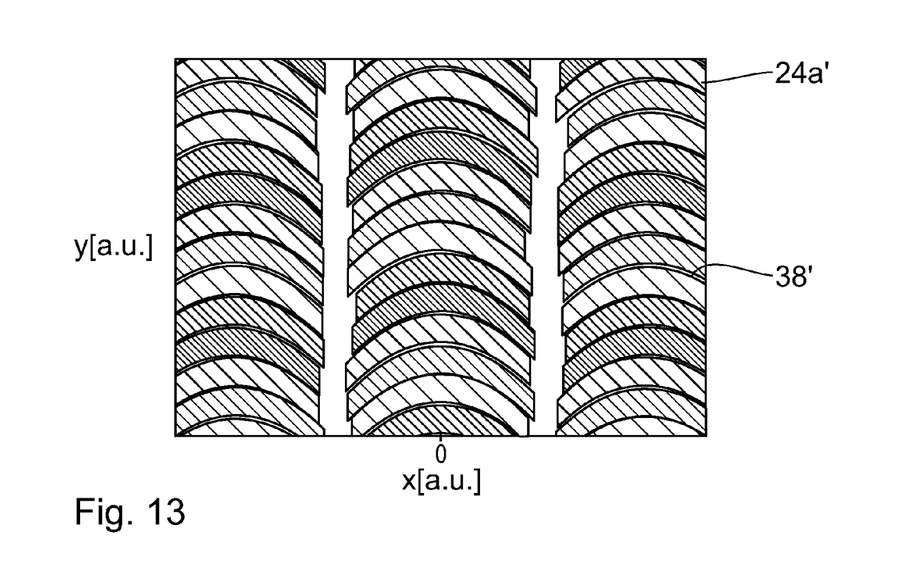
FIG. 13 shows, with regard to the field facet mirror, an illustration which is similar to FIG. 7, is abstracted to a greater extent with regard to the group assignment and shows a plurality of the individual-mirror groups, the imaging-aberration-compensating individual-mirror assignment of which is implemented in accordance with the alternative arrangement according to FIG. 11.

FIG. 13 illustrates such a sheared arrangement of arcuate individual-mirror groups 24a' on the field facet mirror 19, an excerpt from which is illustrated in FIG. 13. FIG. 13 shows exemplary edge contours 38' of a plurality of the individual-mirror groups 24a' sheared for compensation of the tilting imaging aberration. The individual-mirror groups 24a' are constructed from so many individual mirrors 26 that an individual-mirror grid is no longer visible in FIG. 13. The illustration shows explicitly the edge contour 38' of the respective individual-mirror group 24a'.

The possible compensation arrangements of the sheared individual-mirror groups 24a' correspond to those described for monolithic field facets in FIGS. 15 and 17 of WO 2010/037453 A1. Of course, the individual-mirror group 24a can also have a shear proceeding from a rectangular basic shape, that is to say proceeding from an arrangement according to FIG. 7, in which case edge contours of the individual-mirror groups can then be arranged in a manner corresponding to FIGS. 16 and 17 of WO 2010/037453 A1.

Figure 14:
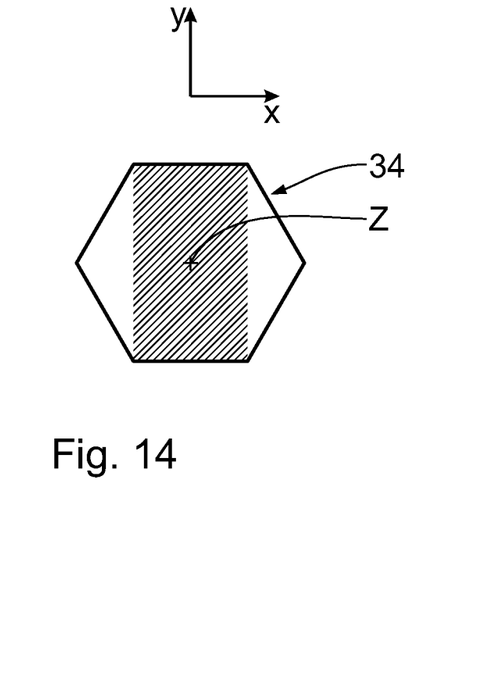
FIG. 14 shows a facet of the second facet mirror having a hexagonal boundary in a first orientation variant.
Figure 15:
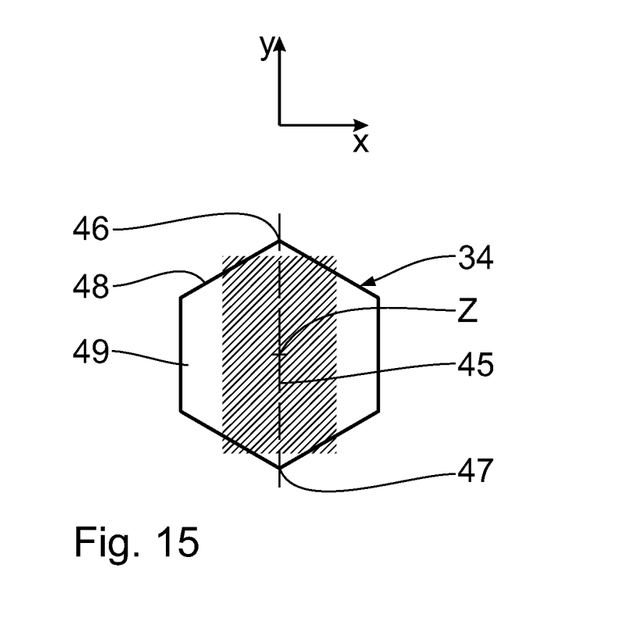
FIG. 15 shows a facet of the second facet mirror, likewise having a hexagonal boundary, in a second orientation variant.

The orientation of the individual mirrors 26 of the individual-mirror group 24a in such a way that different target locations 44, are achieved for the individual-mirror illumination channels, the target locations being offset in the y-direction with respect to one another, has the effect that on the pupil facets 34, that is to say on the facets of the second facet mirror 20, a more extensive area is illuminated in the y-direction than in the x-direction. With the use of pupil facets 34 shaped with a hexagonal boundary (cf. FIGS. 14 and 15), that can be taken into account by virtue of the fact that two mutually opposite corners 46, 47 of a facet boundary 48 of a reflection surface 49 of the pupil facet mirror 34 have the same x-coordinate as the centre Z of the reflection surface 49 of the pupil facet 34. The pupil facets 34 are then arranged such that they are more extensive with regard to their reflection surface 49 along the target-location path 45 than perpendicular thereto.

Alternatively, other designs of the pupil facets 34 are also possible which differ in their extent along the target-location path and transversely with respect to the target-location path and have a larger extent along the target-location path 45. Examples of pupil facets 34 shaped in this way are rectangularly shaped pupil facets 34, elliptically shaped pupil facets 34 or else double-conically shaped pupil facets 34.

The pupil facet mirror 20 can have pupil facets 34 which differ in their extent along the target-location path 45. It is thereby possible to take account of the circumstance that the same absolute y-offset of the target locations 44, does not have to occur on all of the pupil facets 34. Since the absolute y-offset of the target locations 44, with respect to one another on the respective pupil facets 34 is dependent on the magnitude of the tilting imaging aberration that occurs in each case, it suffices to design the pupil facets 34 along the target-location path 45 with an extent sufficiently adapted to the respective compensation requirement.

As an alternative or in addition to the described edge contour compensation by shearing of the edge contour 38' of the individual-mirror group 24a', a selection of the individual mirrors 26 on the first facet mirror 19 can be implemented so as to compensate for a varying imaging scale of the imaging of the respective individual-mirror group 24a' into the object field 5 depending on the assignment of the individual-mirror group 24a' to a pupil facet 34. Depending on the position of the individual-mirror group 24a' on the field facet mirror 19 and depending on the assignment to a pupil facet 34, the individual-mirror group, via corresponding assignment of the individual mirrors 26 having a different size, that is to say a different absolute extent in the x- and y-directions, can therefore be predefined such that a correctly sized imaging onto the object field 5 is effected in a manner governed by the assignment-dependent imaging scale.

During projection exposure with the aid of the projection exposure apparatus 1, firstly an illumination geometry is set with the aid of the setting method explained above. At least one part of the reticle 7 in the object field 5 is then imaged onto a region of the light-sensitive layer onto the wafer 13 in the image field 11 for the lithographic production of a micro- or nanostructured component, in particular of a semiconductor component, for example of a microchip. In this case, the reticle 7 and the wafer 13 are moved in a temporally synchronized manner in the y-direction continuously in a scanner operation.

The invention claimed is:

1. An illumination optical unit configured to guide illumination light toward an object field, the illumination optical unit comprising:
   a first facet mirror comprising a plurality of individual mirrors, each mirror configured to provide a corresponding individual mirror illumination channel to guide illumination light partial beams toward the illumination field; and
   a second facet mirror downstream of the first facet mirror in a beam path of the illumination light, the second facet mirror comprising a plurality of facets, each facet being configured to contribute to imaging a corresponding group of the individual mirrors of the first facet mirror into the object field via a group-mirror illumination channel which comprises the individual mirror illumination channels of the individual mirror group,
   wherein:
      the individual mirrors of the first facet mirror and the facets of the second facet mirror are configured so that images of different individual mirror groups are superimposed on one another in the object field via the corresponding group mirror illumination channels;
      the individual mirrors of the individual mirror groups are configured to at least partially compensate imaging aberrations which occur depending on an assignment of the individual mirror groups of the first facet mirror to the facets of the second facet mirror when imaging the individual mirror groups into the object field; and the illumination optical unit is an EUV projection lithography illumination optical unit.

2. The illumination optical unit of claim 1, wherein the individual mirrors of the individual mirror groups are configured to guide the individual mirror illumination channels of the individual mirror groups toward different target locations on the corresponding facet of the second facet mirror.

3. The illumination optical unit of claim 2, wherein the individual mirrors are configured so that the different target locations on the corresponding facet of the second facet mirror are arranged along a target location path running over the facet.

4. The illumination optical unit of claim 3, wherein the individual mirrors are configured so that the target location path runs rectilinearly.

5. The illumination optical unit of claim 1, wherein reflection surfaces of the facets of the second facet mirror have a larger extent along a target location path than perpendicularly thereto.

6. The illumination optical unit of claim 5, wherein the second facet mirror comprises having extents that differ in terms of their extent along the target location path.

7. The illumination optical unit of claim 2, wherein:
the object field is spanned by two object field coordinates; and
the individual mirrors of an individual mirror group which belong to the same coordinate value of one of the two object field coordinates are configured to guide the individual mirror illumination channels of the individual mirrors toward the same target location on the corresponding facet of the second facet mirror.

8. The illumination optical unit of claim 1, wherein the individual mirrors of the first facet mirror are configured so that a size and/or edge contour of the individual mirror group of the first facet mirror, taking account an imaging scale of imaging of the individual mirror group into the object field, deviate(s) from a size and/or edge contour of the object field so that the deviation compensates for the imaging aberrations.

9. An illumination system, comprising:
an illumination optical unit according to claim 1; and
a projection optical unit configured to image the object field into an image field.

10. An apparatus, comprising:
an EUV light source;
an illumination optical unit according to claim 1; and
a projection optical unit configured to image the object field into an image field,
wherein the apparatus is a projection exposure apparatus.

11. The apparatus of claim 10, wherein a target location path runs parallel to a displacement direction.

12. A method of operating a projection exposure apparatus comprising an illumination optical unit and a projection optical unit, the method comprising:
using the illumination optical unit to illuminate at least some structures of a reticle; and
using the projection optical unit to image at least some of the illuminated structure onto a light-sensitive material, wherein the projection optical unit comprises an illumination unit according to claim 1.

13. An illumination optical unit configured to guide illumination light toward an object field, the illumination optical unit comprising:
a first facet mirror comprising a plurality of individual mirrors, each mirror configured to provide a corresponding individual mirror illumination channel to guide illumination light partial beams toward the illumination field; and
a second facet mirror downstream of the first facet mirror in a beam path of the illumination light, the second facet mirror comprising a plurality of facets, each facet being configured to contribute to imaging a corresponding group of the individual mirrors of the first facet mirror into the object field via a group-mirror illumination channel which comprises the individual mirror illumination channels of the individual mirror group,
wherein:
individual mirrors of the first facet mirror and the facets of the second facet mirror are configured so that images of different individual mirror groups are superimposed on one another in the object field via the corresponding group mirror illumination channels;
the individual mirrors of the individual mirror groups are configured so that the individual mirror illumination channels of the individual mirror groups are guided toward different target locations on the corresponding facet of the second facet mirror; and
the illumination optical unit is an EUV projection lithography illumination optical unit.

14. The illumination optical unit of claim 13, wherein the individual mirrors are configured so that the different target locations on the corresponding facet of the second facet mirror are arranged along a target location path running over the facet.

15. The illumination optical unit of claim 14, wherein the individual mirrors are configured so that the target location path runs rectilinearly.

16. The illumination optical unit of claim 13, wherein reflection surfaces of the facets of the second facet mirror have a larger extent along a target location path than perpendicularly thereto.

17. The illumination optical unit of claim 16, wherein the second facet mirror comprises having extents that differ in terms of their extent along the target location path.

18. The illumination optical unit of claim 13, wherein:
the object field is spanned by two object field coordinates; and
the individual mirrors of an individual mirror group which belong to the same coordinate value of one of the two object field coordinates are configured to guide the individual mirror illumination channels of the individual mirrors toward the same target location on the corresponding facet of the second facet mirror.

19. An illumination system, comprising:
an illumination optical unit according to claim 13; and
a projection optical unit configured to image the object field into an image field.

20. An apparatus, comprising:
an EUV light source;
an illumination optical unit according to claim 13; and
a projection optical unit configured to image the object field into an image field,
wherein the apparatus is a projection exposure apparatus.

21. The apparatus of claim 20, wherein a target location path runs parallel to a displacement direction.

22. A method of operating a projection exposure apparatus comprising an illumination optical unit and a projection optical unit, the method comprising:
using the illumination optical unit to illuminate at least some structures of a reticle; and
using the projection optical unit to image at least some of the illuminated structure onto a light-sensitive material, wherein the projection optical unit comprises an illumination unit according to claim 13.

* * * * *